(12) United States Patent
Yan

(10) Patent No.: US 10,985,698 B2
(45) Date of Patent: Apr. 20, 2021

(54) DIFFERENTIAL ELECTRO-MECHANICAL OSCILLATING CIRCUITS AND RELATED METHODS

(71) Applicant: Analog Devices, Inc., Norwood, MA (US)

(72) Inventor: Jiefeng Yan, Andover, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 16/546,094

(22) Filed: Aug. 20, 2019

(65) Prior Publication Data

US 2021/0058032 A1 Feb. 25, 2021

(51) Int. Cl.
*H03B 5/30* (2006.01)
*H03M 1/40* (2006.01)
*H03B 5/06* (2006.01)

(52) U.S. Cl.
CPC ............... *H03B 5/30* (2013.01); *H03B 5/06* (2013.01); *H03M 1/403* (2013.01)

(58) Field of Classification Search
CPC ............ H03B 5/30; H03B 5/06; H03M 1/403
See application file for complete search history.

(56) References Cited

U.S. PATENT DOCUMENTS

| | | | |
|---|---|---|---|
| 6,437,652 B1 | 8/2002 | Gomez | |
| 6,696,898 B1 | 2/2004 | Ward et al. | |
| 6,861,917 B2 | 3/2005 | Stevenson et al. | |
| 6,927,640 B2 | 8/2005 | Gomez | |
| 6,956,443 B2 | 10/2005 | Ruffieux | |
| 9,071,194 B1 * | 6/2015 | Djahanshahi | H03B 5/06 |
| 9,300,249 B2 | 3/2016 | Rajavi et al. | |
| 9,531,323 B1 | 12/2016 | Khalili et al. | |
| 9,553,545 B1 | 1/2017 | Khalili et al. | |
| 9,847,753 B2 | 12/2017 | Ho et al. | |
| 10,256,797 B2 | 4/2019 | Lam | |

(Continued)

OTHER PUBLICATIONS

Ghahramani et al., A 192MHz Differential XO Based Frequency Quadrupler with Sub-Picosecond Jitter in 28nm CMOS. 2015 IEEE Radio Frequency Integrated Circuits Symposium. 2015; p. 59-62.

(Continued)

*Primary Examiner* — Jeffrey M Shin
(74) *Attorney, Agent, or Firm* — Wolf, Greenfield & Sacks, P.C.

(57) ABSTRACT

Differential electro-mechanical oscillating circuits are described. These circuits may be used in a variety of contexts to produce differential oscillating signals, such as sine waves or square waves. A switched capacitor circuit (SCC) is used to prevent low-frequency locking, whereby the output of the resonator would otherwise lock to a constant value. More specifically, the SCC provides an impedance in parallel to the resonator between the output terminals of oscillating circuit. The SCC is designed so that, at low frequencies, its impedance is lower than the impedance of the resonator. The presence of such an impedance prevents the formation of an open circuit between the output terminals, thus maintaining the oscillating circuit in the oscillation mode. The differential electro-mechanical oscillating circuits described herein may be used to produce clock signals or otherwise to produce periodic reference signals.

20 Claims, 9 Drawing Sheets

(56) References Cited

U.S. PATENT DOCUMENTS

| | | | |
|---|---|---|---|
| 2006/0114074 A1* | 6/2006 | Matsui | H03B 5/366 |
| | | | 331/177 V |
| 2010/0026402 A1 | 2/2010 | Chang et al. | |
| 2014/0070897 A1* | 3/2014 | Brekelmans | H03L 5/00 |
| | | | 331/109 |
| 2016/0028349 A1 | 1/2016 | Rajavi et al. | |
| 2019/0103837 A1 | 4/2019 | Madala et al. | |
| 2019/0109561 A1 | 4/2019 | Bahr et al. | |

OTHER PUBLICATIONS

Guillot et al., A 2GHz 65nm CMOS Digitally-Tuned BAW Oscillator. 15$^{th}$ IEEE International Conference on Electronics, Circuits and Systems. Sep. 2008; pp. 722-725.

* cited by examiner

DIFFERENTIAL ELECTRO-MECHANICAL OSCILLATING CIRCUITS AND RELATED METHODS

FIELD OF THE DISCLOSURE

The technology described in the present application relates to oscillators for generating differential oscillating signals.

BACKGROUND

Oscillators are circuits designed to generate oscillating electric signals, such as sine waves or square waves. Oscillators convert direct current (DC) from a power supply to alternating current (AC) signals. Oscillators are employed in a variety of electronic devices including processors, memories, peripherals, digital instruments and sensor read-out circuits.

SUMMARY OF THE DISCLOSURE

Some embodiments relate to differential electro-mechanical oscillating circuits. These circuits may be used in a variety of contexts to produce differential oscillating signals, such as sine waves or square waves. A switched capacitor circuit (SCC) is used to prevent low-frequency locking, whereby the output of the resonator would otherwise lock to a constant value. More specifically, the SCC provides an impedance in parallel to the resonator between the output terminals of oscillating circuit. The SCC is designed so that, at low frequencies, its impedance is lower than the impedance of the resonator. The presence of such an impedance prevents the formation of an open circuit between the output terminals, thus maintaining the oscillating circuit in the oscillation mode. The differential electro-mechanical oscillating circuits described herein may be used to produce clock signals or otherwise to produce periodic reference signals.

Some embodiments relate to a differential electro-mechanical oscillating circuit. The circuit comprises a crystal oscillator exhibiting at least one resonant frequency; a latch coupled to the crystal oscillator; a switched capacitor circuit coupled to the latch; and control circuitry configured to actuate the switched capacitor circuit at a frequency substantially equal to or greater than the at least one resonant frequency of the crystal oscillator.

Some embodiments relate to a differential electro-mechanical oscillating circuit. The circuit comprises a crystal oscillator; a latch coupled to the crystal oscillator and having a switch; a switched capacitor circuit coupled to the latch; and a phased-locked loop (PLL) coupled to the switch and the latch.

Some embodiments relate to a method for controlling an electro-mechanical oscillating circuit. The method comprises activating a first portion of a latch to produce a single-ended oscillation signal, the latch being coupled to a crystal oscillator; generating, based on the single-ended oscillation signal, first and second control signals; controlling a switched capacitor circuit with the first and second control signals; and activating a second portion of the latch to produce a differential oscillation signal.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Aspects of the present application relate to differential electro-mechanical oscillating circuits including switched capacitor circuits arranged to prevent low-frequency locking, thereby maintaining the oscillating circuits in the oscillation mode. In the oscillation mode, an oscillating circuit outputs an oscillating signal—a signal that is periodic at least within a certain time interval. Examples of oscillation signals include sine waves and square waves. Low-frequency locking occurs in some oscillating circuits as a result of the oscillator behaving as an open circuit at low frequencies (e.g., at frequencies less than 100 Hz), which in turn locks the output of the oscillating circuit to a constant value. This causes the oscillating circuit to exit the oscillation mode.

Aspects of the present application relate to techniques for introducing an impedance in the oscillating circuit, the impedance being selected to prevent the formation of open circuits at low frequencies. The value of the impedance may be set in some embodiments by appropriately selecting the frequency of actuation of the switched capacitor circuit. In some embodiments, the actuation frequency may be selected from the frequency band of the oscillator, or may at least be equal or greater than a resonant frequency of the oscillator. The differential electro-mechanical oscillating circuits described herein may be used in a variety of contexts in which it is desirable to produce differential oscillating signals. One such context involves circuits that require clock signals, or other periodic signals, to operate.

Figure 1:
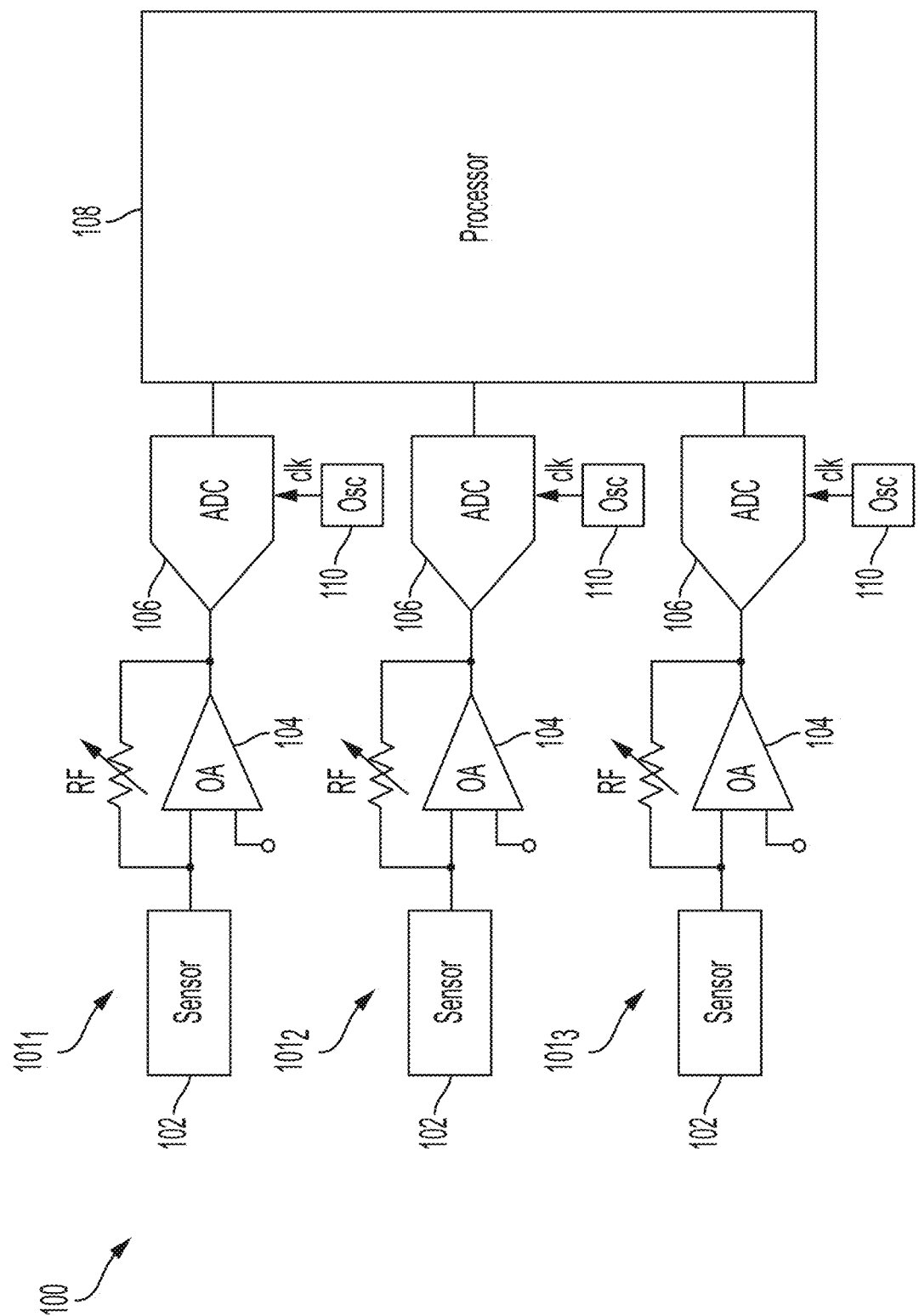
FIG. 1 is a block diagram illustrating a quantity detector.

Applicant has appreciated that some oscillating circuits tend to give rise to interference, which can significantly degrade the performance of electronic circuits positioned near the oscillating circuit. In some embodiments, interference arises due to the reactive nature of the oscillating circuit, whereby the oscillating signal inadvertently couples to other electronic circuits via capacitive and/or inductive coupling. Alternatively, or additionally, interference arises due to the reactive nature of the printed circuit boards on which resonators are typically mounted. Regardless of how it generates, interference can seriously hinder the circuit's ability to carry out the functionalities for which it is designed. Consider for example the circuit of FIG. 1, which depicts a quantity detector. Quantity detector 100 is a circuit for detecting a certain quantity of interest to a user, such as temperature, pressure, velocity, angular motion, etc. Quantity detector 100 includes three channels in this example, channels $101_1$, $101_2$ and $101_3$. Each channel includes a sensor 102 (where the type of sensor depends on the quantity of interest), an operational amplifier (OA) 104, an analog-to-digital converter (ADC) 106 and an oscillator (osc) 110. OA 104 forms a trans-impedance amplifier with resistor $R_F$, and converts current signals to voltage signals. The output of each channel is processed using processor 108. Oscillators 110 generate clock signals clk, which set the timing with which ADCS 106 sample the signals detected by sensors 102.

Due to the capacitive nature of oscillators 110 and/or the printed circuit board, the clock signals clk may inadvertently couple to electronic circuits. For example, the clock signal driving the ADC of channel $101_3$ may inadvertently couple to the sensor 102 of channel $101_2$. This interference can reduce the signal-to-noise ratio at channel $101_2$, thus negatively affecting its ability to sense the quantity of interest.

Applicant has appreciated that interference in oscillating circuits may be mitigated by producing differential—rather than single-ended—oscillating signals. Applicant has appreciated, in fact, that the pair of signals that constitute a differential signal are typically subject to the same (or substantially the same) interference, and that such interference may be removed or at least attenuated by subtracting one signal of the pair from the other signal of the pair. Accordingly, aspects of the present application relate to differential oscillating circuits.

Figure 2C:
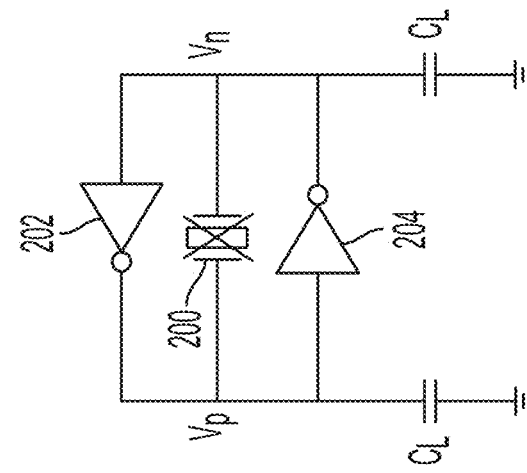
FIG. 2C is a block diagram illustrating the equivalent circuit of FIG. 2B at low frequencies, in accordance with some non-limiting embodiments.
Figure 2B:
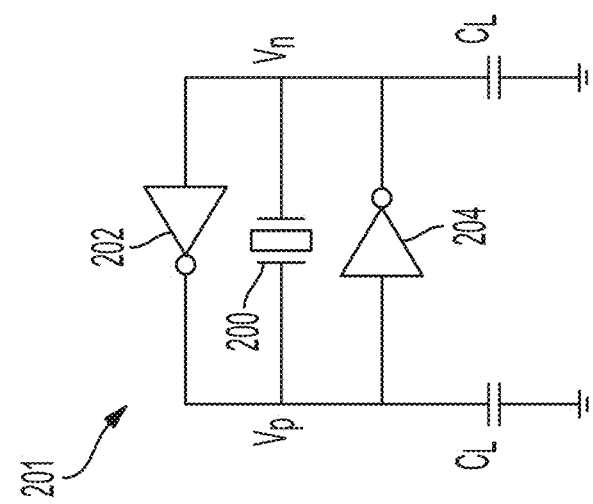
FIG. 2B is a block diagram illustrating a differential oscillating circuit including the resonator of FIG. 2A, in accordance with some non-limiting embodiments.
Figure 2A:
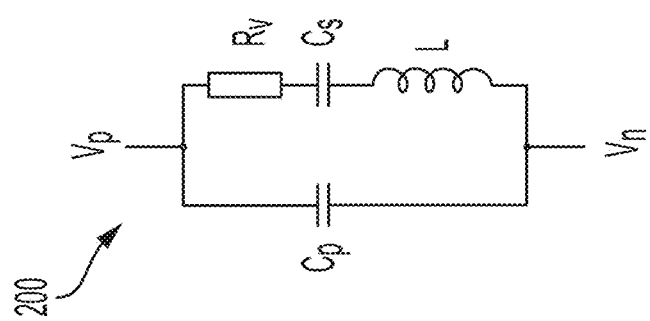
FIG. 2A is a block diagram illustrating a resonator, in accordance with some non-limiting embodiments.

FIG. 2A illustrates the equivalent circuit of a resonator that may be used in some embodiments to form a differential oscillating circuit. Resonator 200 may include a crystal (e.g., a quartz) oscillator in some embodiments. Resonator 200 includes a parallel capacitance $C_P$ and a series capacitance $C_S$. Capacitance $C_S$ is in series with a resistance Rv and an inductance L. It should be appreciated, however, that resonators of the types described herein may embody circuit models other than the one shown in FIG. 2A.

FIG. 2B illustrates an oscillating circuit based on resonator 200. Oscillating circuit 201 includes resonator 200, capacitances $C_L$, and inverters 202 and 204. Inverters 202 and 204 are arranged in a back-to-back configuration (with the output of inverter 202 coupled to the input of inverter 204 and the output of inverter 204 coupled to the input of inverter 202). Accordingly, inverters 202 and 204 may be collectively viewed as a latch.

During operation, inverters 202 and 204 cause the circuit to oscillate in the oscillation frequency band of resonator 200. As a result, a pair of oscillating voltages $V_p$ and $V_n$ constituting a differential signal pair is generated.

Applicant has appreciated, however, that the oscillating circuit of FIG. 2C suffers from an anomaly referred to herein as "low-frequency locking," in which the circuit's output is locked to a constant value. At low frequencies (such as less than 100 Hz or less than 10 Hz), capacitances $C_P$ and $C_S$ exhibit large impedances and therefore behave effectively as open circuits. The result is that, at these frequencies, resonator 200 also behaves as an open circuit. This circumstance is illustrated in FIG. 2C, where, due to the large impedance of the capacitances, resonator 200 is effectively an open circuit. In this circumstance, inverters 202 and 204 lock to one another, causing $V_n$ to lock to the supply voltage and $V_p$ to lock to ground (or vice versa). Thus, oscillating circuit 201 inadvertently exits the oscillation mode and produces a constant output.

Applicant has appreciated that low-frequency locking may be prevented by placing a switched capacitor circuit between the output terminals of the oscillating circuit and by controlling the switched capacitor within the frequency oscillation band of the resonator. Switched capacitors circuits of the types described herein may be circuits including at least one capacitor and at least one switch, and in which the at least one switch controls charge and/or discharge of the at least one capacitor. In some embodiments, the capacitor is connected directly (e.g., with no electric components therebetween other than conductive traces or wires) to the switch. In other embodiments, the capacitor is connected indirectly (e.g., with one or more electric components therebetween such as resistors) to the switch.

Figure 3:
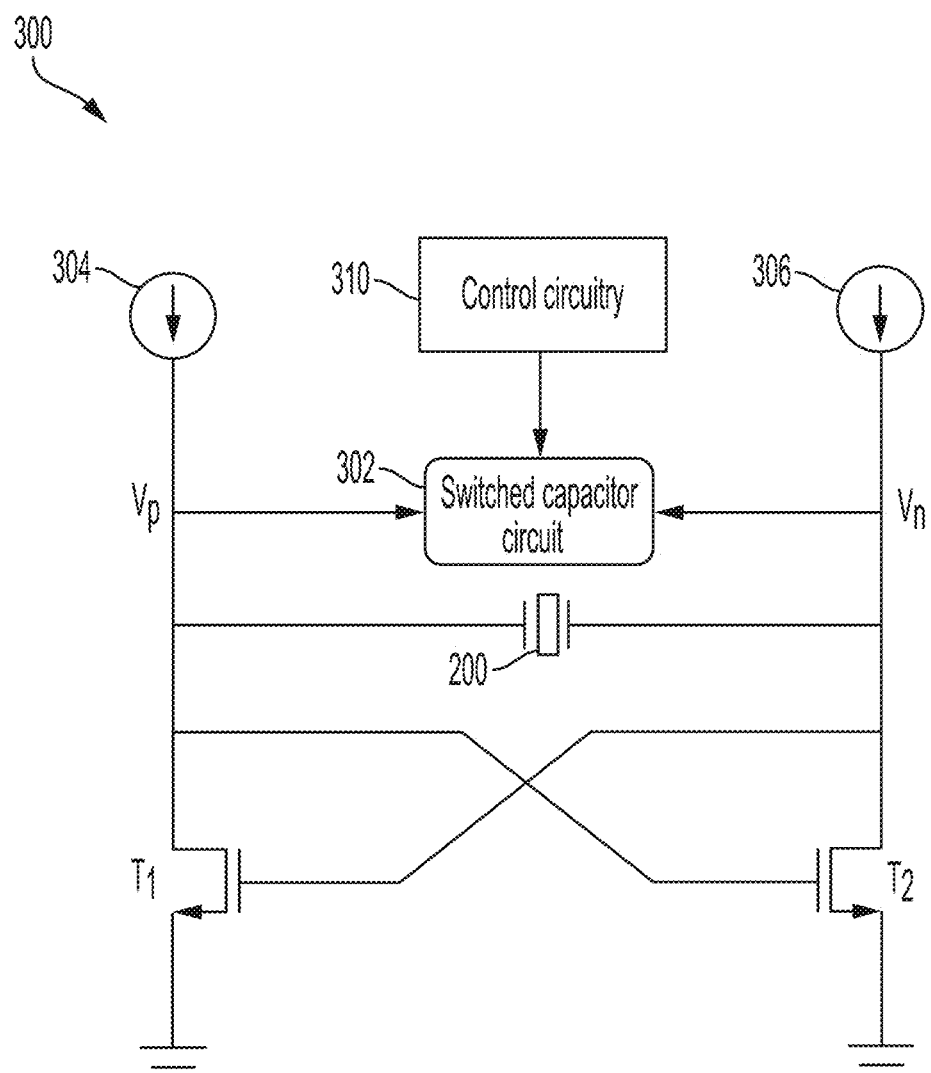
FIG. 3 is a block diagram illustrating another differential oscillating circuit, in accordance with some non-limiting embodiments.

One such oscillating circuit is illustrated in FIG. 3, in accordance with some non-limiting embodiments. Differential electro-mechanical oscillating circuit 300 includes resonator 200, switched capacitor circuit (SCC) 302, transistors $T_1$ and $T_2$, current generators 304 and 306 and control circuitry 310. Oscillating circuit 300 produces a differential oscillating signal pair ($V_p$, $V_n$) at its output terminals. Resonator 200 and SCC 302 are each coupled to such output terminals.

Transistors $T_1$ and $T_2$ are arranged in a back-to-back configuration, with the drain of $T_1$ being coupled to the gate of $T_2$ and the drain of $T_2$ being coupled to the gate of $T_1$, though other back-to-back configuration are also possible. As such, transistors $T_1$ and $T_2$ may be viewed as a latch. Transistors $T_1$ and $T_2$ may be implemented using any suitable type of transistors, including for example field effect transistors (FET), metal-oxide-semiconductor (MOS) transistors and bipolar junction transistors (BJT), among others.

In some embodiments, a pair of inverters as illustrated in FIG. 2B may be used in lieu of transistors $T_1$ and $T_2$ to form a latch. Alternatively, or additionally, any other bi-stable circuit may be used to form a latch. Transistors $T_1$ and $T_2$, together with resonator 200, cause oscillating circuit 300 to oscillate. As a result, signals $V_p$ and $V_n$ oscillate periodically, with substantially opposite magnitudes.

SCC 302 is arranged to prevent low-frequency locking of transistors $T_1$ and $T_2$. More specifically, SCC 302 provides an impedance in parallel to that of resonator 200 between the output terminals of oscillating circuit 300. SCC 302 is designed so that, at low frequencies, its impedance is lower than the impedance of resonator 200 at the same frequencies. The presence of such an impedance prevents the formation of an open circuit between the output terminals. The impedance of SCC 302 may be set by selecting the frequency with which its switch(es) are actuated, given the frequency-dependent nature of a capacitor's impedance. Control circuitry 310 controls the actuation frequency of SCC 302.

Figure 4:
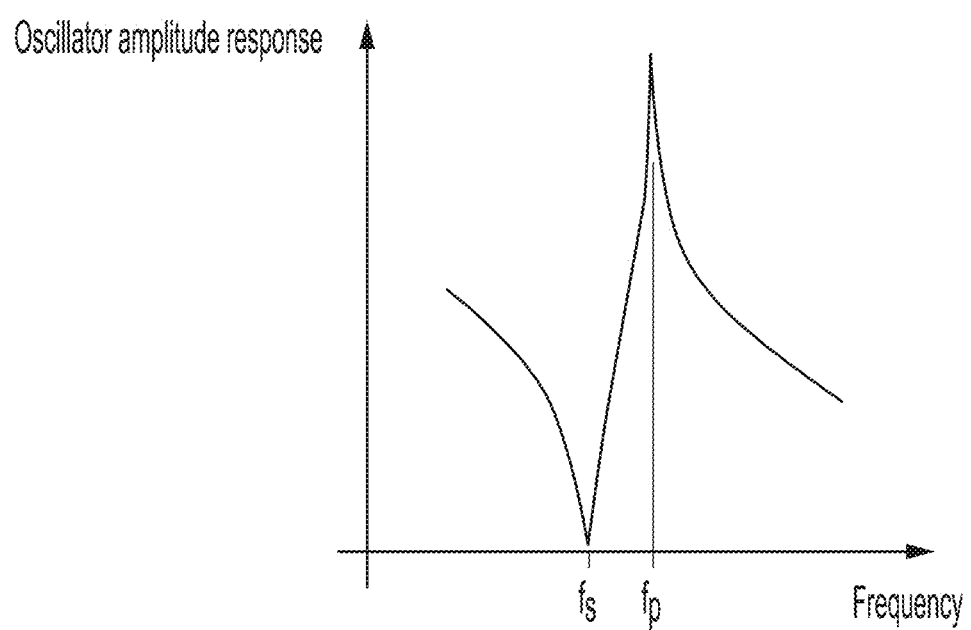
FIG. 4 is a plot illustrating the frequency response of the resonator of FIG. 2A, in accordance with some non-limiting embodiments.

In some embodiments, control circuitry 310 actuates SCC 302 at a frequency selected from within the oscillation band of resonator 200. FIG. 4 is a plot illustrating the amplitude response of a resonator 200. In this example, resonator 200 exhibits two resonant frequencies: $f_s$ and $f_p$. The oscillation band of resonator 200, in this example, is defined as the band between $f_s$ and $f_p$ (including $f_s$ and $f_p$). Frequency $f_s$ (referred to as a "series resonance frequency") represents the frequency with which series capacitor $C_s$ (see FIG. 2A) resonates and frequency $f_p$ (referred to as a "parallel resonance frequency") represents the frequency with which parallel capacitor $C_p$ (see FIG. 2A) resonates. In other circumstances, however, frequency $f_s$ may be greater than frequency $f_p$, as not all embodiments are limited to the response of FIG. 4

In some embodiments, control circuitry 310 actuates SCC 302 with a frequency that is greater than at least one of the resonant frequencies of resonator 200. For example, control circuitry 310 may actuate SCC 302 with a frequency that is greater than the lowest resonant frequency ($f_s$ in the example of FIG. 4) of resonator 200, that is greater than the second lowest resonant frequency ($f_p$ in the example of FIG. 4) of resonator 200, or, if resonator 200 exhibits more than two resonant frequencies, greater than any other resonant frequency. Applicant has appreciated that actuating SCC 302 with a frequency that is greater than at least one of the resonant frequencies of resonator 200 produces an impedance sufficiently low to prevent low-frequency locking.

Figure 5A:
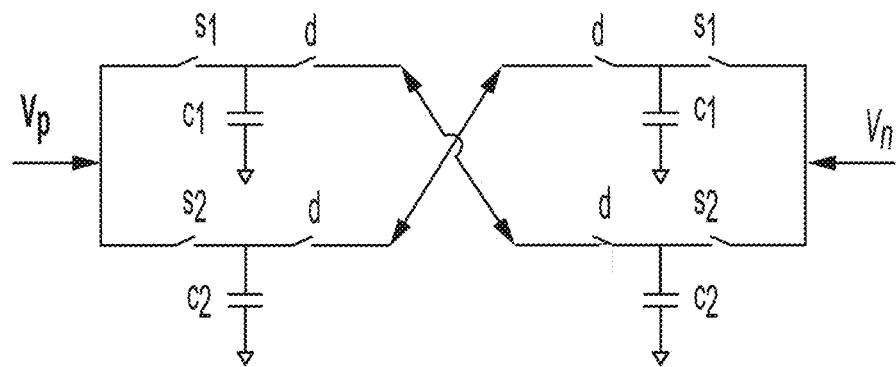
FIG. 5A is a circuit diagram illustrating an example switched capacitor circuit that may be used in connection with the differential oscillating circuit of FIG. 3, in accordance with some non-limiting embodiments.

SCC 302 may be implemented in any suitable way, including for example with the circuit of FIG. 5A, in accordance with some non-limiting embodiments. In some embodiments, the SCC may be symmetric, so that the SCC exhibits the same impedance whether seen from the output terminal of $V_p$ or from the output terminal of $V_n$. In the circuit of FIG. 5A, for example, both of the output terminals see 1) a switch $S_1$ coupled in series to a switch d, with capacitor $C_1$ between switches $S_1$ and d, and 2) a switch $S_2$ coupled in series to a switch d, with capacitor $C_2$ between switches $S_2$ and d. Having a symmetric circuit may prevent undesired imbalances in the output signal.

Figure 5B:
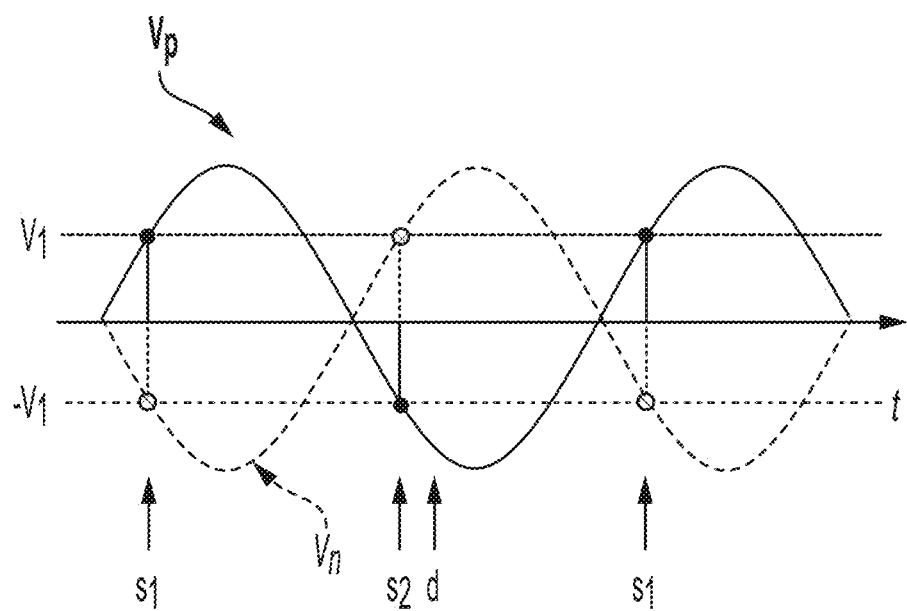
FIG. 5B is a plot illustrating an example differential oscillating signal that may be output by the differential oscillating circuit of FIG. 3, in accordance with some non-limiting embodiments.

Alternatively, or additionally, symmetry of the switched capacitor circuit may be ensured by actuating switches $S_1$ and $S_2$ with substantially opposite phases. FIG. 5B, which plots $V_n$ and $V_p$ over time, illustrates an example in which switches $S_1$ and $S_2$ are actuated with substantially opposite phases. When switches $S_1$ are actuated (are placed in their conductive states), signal $V_p$ is sampled at a certain value ($V_1$ in this example) and signal $V_n$ is sampled at the opposite value ($-V_1$ in this example). Further, when switches $S_2$ are actuated, signal $V_n$ is sampled at the value $V_1$ and signal $V_p$ is sampled at the opposite value $-V_1$. Actuating the switches in this manner ensures that the electric charge is distributed symmetrically among the capacitors, thus preventing undesired imbalances in the differential output signal. Switch d is activated once per cycle to reset the state of the capacitors.

Figure 6A:
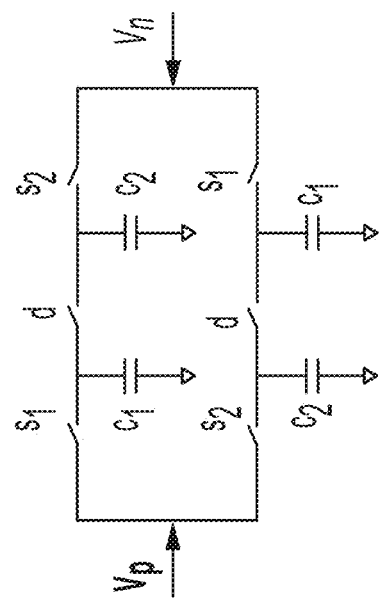
FIGS. 6A-6C are circuit diagrams illustrating other switched capacitor circuits that may be used in connection with the differential electro-mechanical oscillating circuit of FIG. 3, in accordance with some non-limiting embodiments.
Figure 6B:
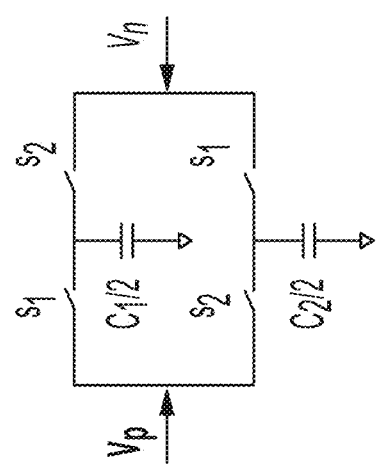
Figure 6C:
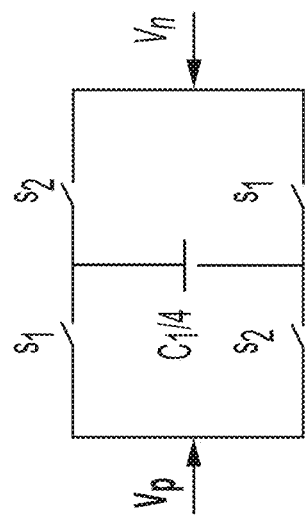

Other examples of switched capacitor circuits are illustrated at FIGS. 6A-6C, in accordance with some non-limiting embodiments. In each of these circuits, the circuit seen from the output terminal of $V_n$ is substantially equal to the circuit seen from the output terminal of $V_p$. The circuit of FIG. 6A includes two switches $S_1$, two switches $S_2$, two switches d, two capacitors $C_1$ and two capacitors $C_2$. The circuit of FIG. 6B includes two switches $S_1$, two switches $S_2$, one capacitor $C_1/2$ and one capacitor $C_2/2$. The circuit of FIG. 6C includes two switches $S_1$, two switches $S_2$, one capacitor $C_1/2$ and one capacitor $C_2/2$. It should be appreciated that SCC 302 is not limited to any of the implementations described herein, as other implementations may be used.

Applicant has appreciated one challenge in the manner with which SCC 302 is actuated as described above. Actuation of SCC 302 may involve producing an actuation signal having a frequency selected from the oscillation frequency band of resonator 200 (or otherwise selected to be greater than one of the resonant frequencies). However, such a signal is not available until an oscillation has been established in the oscillating circuit. At the same time, placing the oscillating circuit in the oscillation mode involves actuating SCC 302, because otherwise the oscillating circuit may incur low-frequency locking. Stated differently, generation of the actuation signal relies on the existence of an oscillation in the oscillating circuit and the existence of an oscillation relies on the actuation signal to prevent low-frequencies locking. In some embodiments, this conundrum may be solved using the initialization method of FIG. 7.

Figure 7:
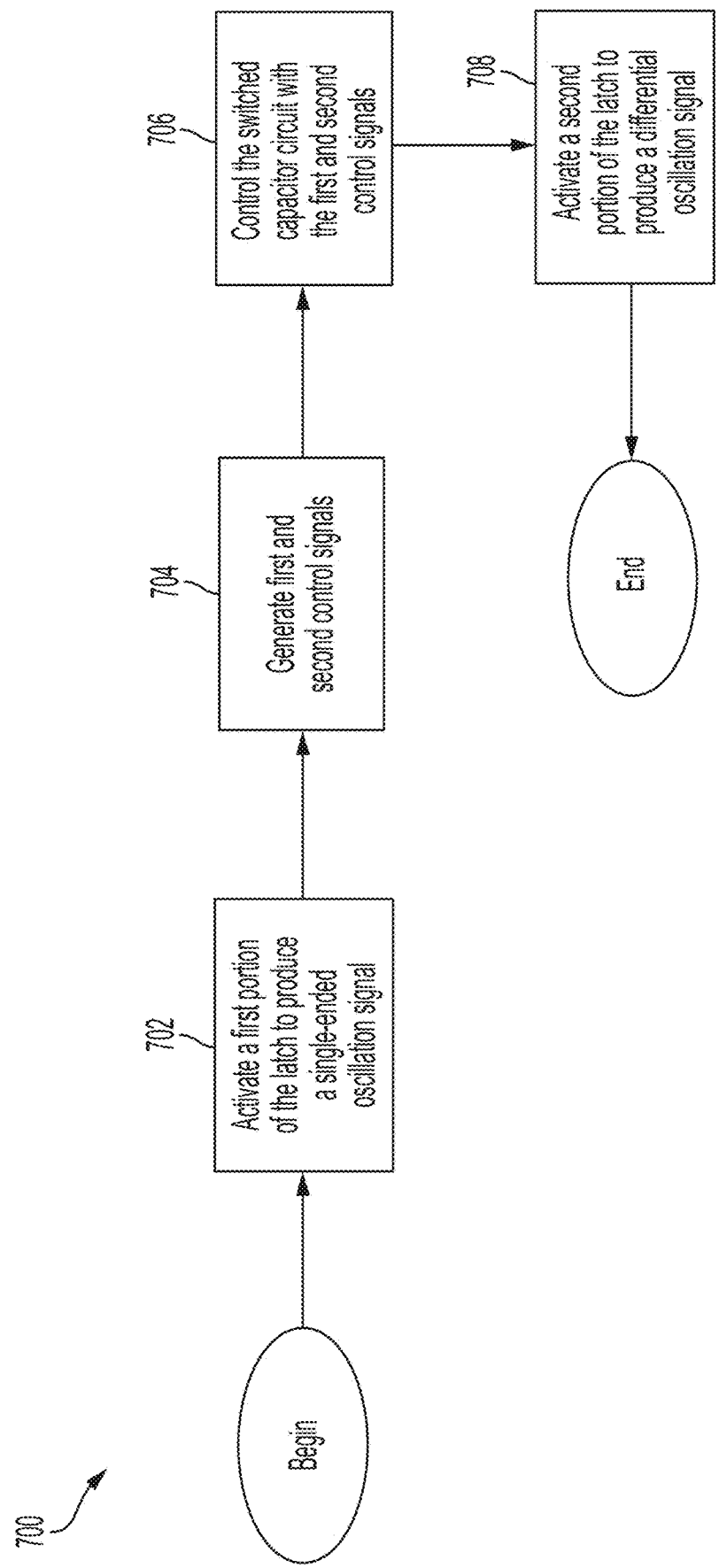
FIG. 7 is a flowchart illustrating a method for controlling an oscillating circuit, in accordance with some non-limiting embodiments.

FIG. 7 is a flowchart illustrating a method for controlling an electro-mechanical oscillating circuit, in accordance with some non-limiting embodiments. In some embodiments, method 700 may be used to control the electro-mechanical oscillating circuit of FIG. 3, and may be executed using control circuitry 310. It should be appreciated, however, that method 300 may be used to control any other suitable type of differential oscillating circuit.

Figure 8A:
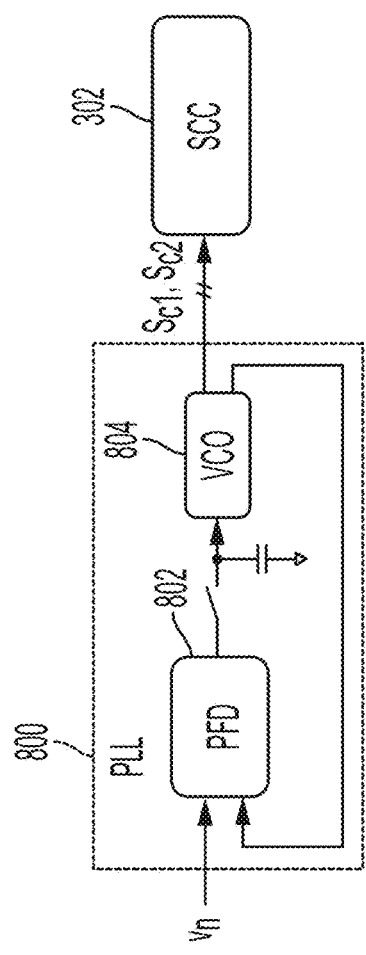
FIG. 8A is a circuit diagram illustrating the differential oscillating circuit of FIG. 3 when only a portion of the circuit is activated, in accordance with some non-limiting embodiments.

Method 700 begins at stage 702, in which a controller activates a first portion of the latch of an electro-mechanical oscillating circuit to produce a single-ended oscillation signal. Referring to the example of FIG. 3, control circuitry 310 may activate one of transistors $T_1$ and $T_2$, but not both, to produce a single-ended oscillation signal. FIG. 8A illustrates a scenario in which only one transistor ($T_2$) is activated while the other transistor ($T_1$) is turned off. This results in the generation of a single-ended oscillation signal ($V_s$) with frequency in the oscillation band of resonator 200.

Figure 8B:
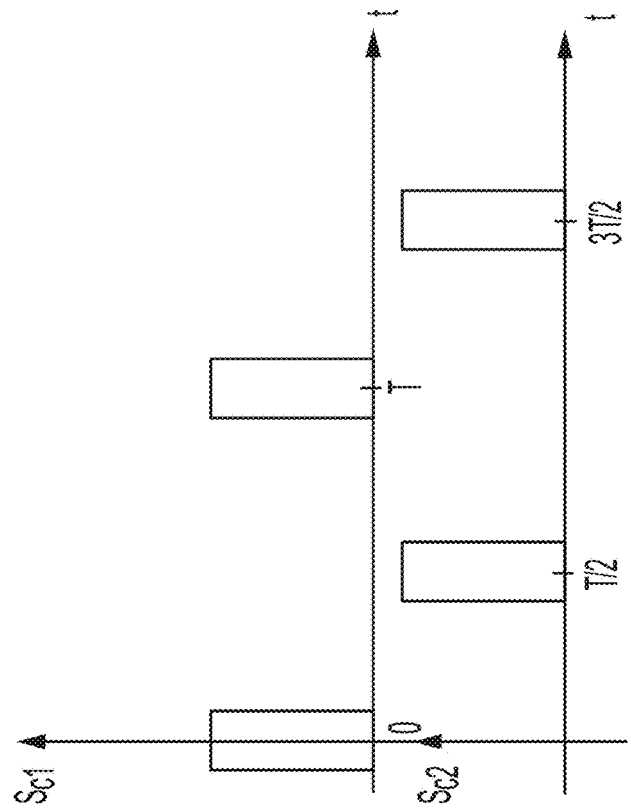
FIG. 8B is a block diagram illustrating a phased locked loop coupled to the switched capacitor circuit of FIG. 3, in accordance with some non-limiting embodiments.

At stage 704, the controller generates, based on the single-ended oscillation signal of stage 702, first and second control signals. Referring now to FIG. 8B, the control signals may be generated, in some embodiments, using a phased-locked loop (PLL). In this example, the single-ended oscillation signal generated at stage 702 is provided as input to PLL 800, which in turn, generates a pair of control signals $S_{c1}$ and $S_{c2}$. PLL 800 may be implemented in any suitable way, including for example with a phase-frequency detector (PFD) 802 and a voltage controlled oscillator (VCO) 804 arranged as shown in FIG. 8B. Other PLL implementations are also possible. PLL 800 may be part of control circuitry 310.

Figure 8C:
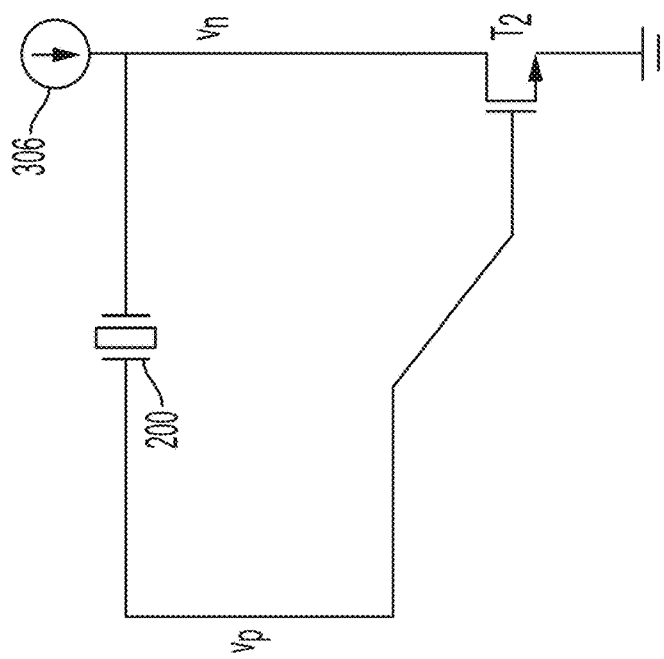
FIG. 8C is a plot illustrating a pair of control signals, in accordance with some non-limiting embodiments.

In some embodiments, PLL 800 is arranged to generate control signals $S_{c1}$ and $S_{c2}$ to be out-of-phase relative to each other. FIG. 8C is a plot illustrating a pair of out-of-phase control signals. In this example, both control signals are periodic with periodicity T (where the periodicity T may be equal to the inverse of a frequency in the oscillation band of resonator 200). Control signal $S_{c1}$ includes pulses at t=0, t=T, t=2T, etc. Control signal $S_{c2}$ includes pulses at t=T/2, t=3T/2, t=5T/2, etc. Therefore, the control signals are delayed by T/2 relative to one another, corresponding to a π-phase difference.

At stage 706, the controller controls the switched capacitor circuit of the oscillating circuit with the first and second control signals. For example, control signals $S_{c1}$ and $S_{c2}$ may control SCC 302. Referring again to FIG. 5A, control signal $S_{c1}$ may control the actuation of switches $S_1$ and control signal $S_{c2}$ may control the actuation of switches $S_2$. As a result, each switch may be set to its conductive state throughout the duration of the received pulse, and may be set to its non-conductive state outside the pulse. Another control signal (not shown in FIG. 8B) may control the actuation of switches d. The switched capacitor circuits of FIGS. 6A-6C may be controlled in a similar fashion.

At stage 708, the controller activates a second portion of the latch to produce a differential oscillation signal. referring again to FIG. 3, control circuitry 310 may activate, at stage 702, transistor $T_1$ (in addition to transistor $T_2$, activated at stage 702). As a result, a differential oscillation signal pair ($V_p$ and $V_n$) is generated.

Figure 9A:
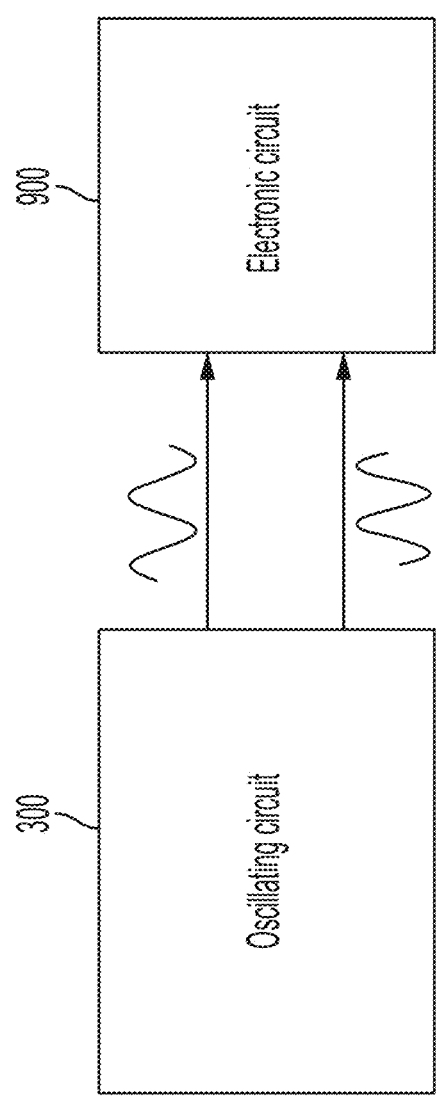
FIG. 9A is a block diagram illustrating a differential oscillating circuit connected to an electronic circuit, in accordance with some non-limiting embodiments.
Figure 9B:
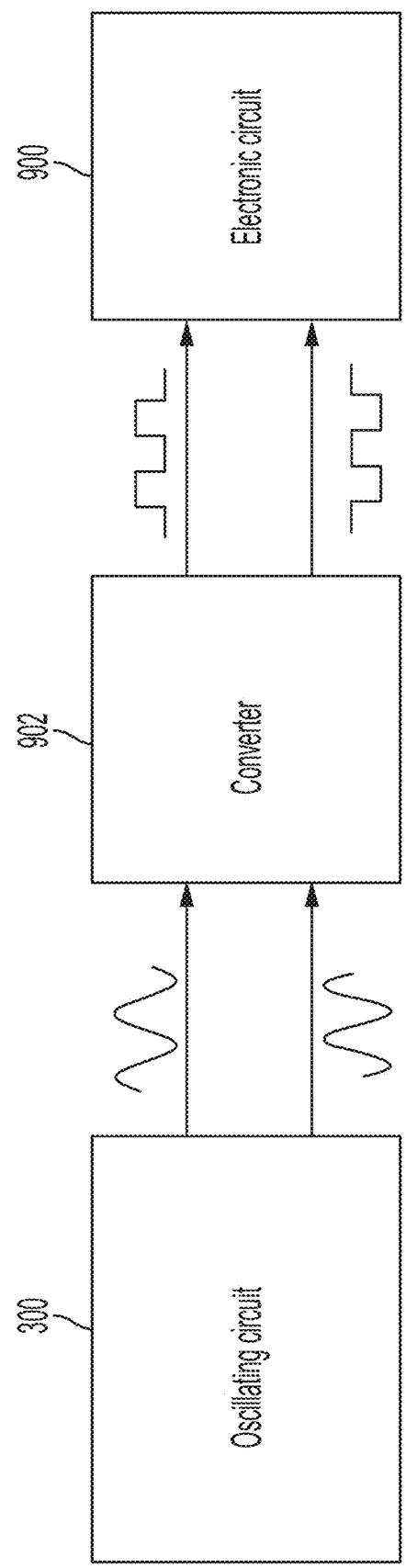
FIG. 9B is a block diagram illustrating a differential oscillating circuit connected to an electronic circuit through a converter, in accordance with some non-limiting embodiments.

Differential oscillating circuits of the types described herein may be used in a variety of contexts, for example to time the operations of one or more electronic circuits. FIG. 9A is a block diagram illustrating a differential oscillating circuit 300 connected to an electronic circuit 900. Oscillating circuit 300 may provide a differential oscillating signal (a sine wave in this example) to electronic circuit 900. The differential oscillating signal may time the operations of electronic circuit 900 or may otherwise provide a reference signal. In some embodiments, signal converters may be used to convert differential sine waves to other types of periodic waves, such as square waves, triangular waves and sawtooth waves. FIG. 9B is a block diagram illustrating an oscillating circuit 300 connected to an electronic circuit 900 through a converter 902. In this example, converter 902 converts a differential sine wave into a differential square wave. Converter 902 may be implemented in any suitable way, including for example with a comparator or a Schmitt trigger circuit. The differential square wave may be used as a clock for timing the operations of electronic circuit 900.

Electronic circuit 900 may include any of numerous systems including but not limited to processors, memories, analog-to-digital converters, peripheral devices, I/O ports, laboratory equipment (e.g., oscilloscopes, spectrum analyzers, vector network analyzers, signal generators, digital pattern generators, pseudo random bit sequence generators, pulse generators, cable testers and frequency counters, among others), receivers and transmitters for wired or wireless communications (digital or analog communications), signal mixers, digital clocks, automatic test equipment and read-out circuitry for a variety of sensors (e.g., accelerometers, gyroscopes, temperature sensors, pressure sensors, heart rate sensors, acoustic sensors, ultrasound sensors, light sensors, infrared sensors, speed sensors, carbon dioxide sensors, nitrogen oxide sensors, pH sensors, flow sensors, anemometers, gas sensors, altimeters, air speed sensors, depth sensors, impact sensors, free fall sensors, gravity sensors, odometers, piezoelectric sensors, position sensors, GPS sensors, laser sensors, ammeters, electrometers, ohmmeters, voltmeters, multimeters, time-of-flight sensors, and proximity sensors, among others).

One specific context involves Lidar systems, in which a differential oscillating circuit may be used, among other functionalities, to time the operations of the read-out circuit for a time-of-flight sensor or to time the operations of an optical phased array.

Aspects of the technology described herein may provide one or more benefits, some of which have been previously described. Now described are some examples of such benefits. It should be appreciated that not all aspects and embodiments necessarily provide all of the benefits now described. Further, it should be appreciated that aspects of the technology described herein may provide additional benefits to those now described.

Aspects of the technology described herein provide oscillating circuits that, compared to other types of oscillating circuits, reduce interference to neighboring circuits. Further aspects of the technology described herein provide differential oscillating circuits configured to limit the negative effects of low-frequency locking.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately," "substantially," and "about" may include the target value.

What is claimed is:

1. A differential electro-mechanical oscillating circuit comprising:
   a crystal oscillator exhibiting at least one resonant frequency;
   a latch coupled to the crystal oscillator;
   a switched capacitor circuit coupled to the latch; and
   control circuitry configured to actuate the switched capacitor circuit at a frequency greater than, or substantially equal to, the at least one resonant frequency of the crystal oscillator.

2. The differential electro-mechanical oscillating circuit of claim 1, further comprising a first output terminal and a second output terminal, wherein the crystal oscillator is configured to generate a differential oscillation signal pair at the first and second output terminals.

3. The differential electro-mechanical oscillating circuit of claim 2, wherein the crystal oscillator, the latch and the switched capacitor circuit are each coupled to each of the first and second output terminals.

4. The differential electro-mechanical oscillating circuit of claim 1, wherein the latch comprises first and second transistors arranged in a back-to-back configuration.

5. The differential electro-mechanical oscillating circuit of claim 4, wherein a gate of the first transistor is coupled to a drain of the second transistor and a gate of the second transistor is coupled to a drain of the first transistor.

6. The differential electro-mechanical oscillating circuit of claim 1, wherein the switched capacitor circuit comprises first and second switches, wherein the control circuitry is configured to actuate the first and second switches out-of-phase.

7. The differential electro-mechanical oscillating circuit of claim 1, wherein the at least one resonant frequency is a series resonance frequency of the crystal oscillator.

8. The differential electro-mechanical oscillating circuit of claim 1, wherein the control circuitry is further configured to:
   activate a first portion of the latch to produce a single-ended oscillation signal;
   generate, based on the single-ended oscillation signal, first and second control signals;

control the switched capacitor circuit with the first and second control signals; and activate a second portion of the latch to produce a differential oscillation signal.

9. A differential electro-mechanical oscillating circuit comprising:
 a crystal oscillator;
 a latch coupled to the crystal oscillator;
 a switched capacitor circuit coupled to the latch and having a switch; and
 a phased-locked loop (PLL) coupled to the switch and the latch, wherein the PLL is configured to actuate the switch.

10. The differential electro-mechanical oscillating circuit of claim 9, wherein the switch is a first switch and the switched capacitor circuit further comprises a second switch, wherein the PLL is configured to actuate the first and second switches out-of-phase.

11. The differential electro-mechanical oscillating circuit of claim 9, further comprising a first output terminal and a second output terminal, wherein the crystal oscillator is configured to generate a differential oscillation signal pair at the first and second output terminals.

12. The differential electro-mechanical oscillating circuit of claim 11, wherein the crystal oscillator, the latch and the switched capacitor circuit are each coupled to each of the first and second output terminals.

13. The differential electro-mechanical oscillating circuit of claim 9, wherein the latch comprises first and second transistors arranged in a back-to-back configuration.

14. The differential electro-mechanical oscillating circuit of claim 13, wherein a gate of the first transistor is coupled to a drain of the second transistor and a gate of the second transistor is coupled to a drain of the first transistor.

15. A method for controlling an electro-mechanical oscillating circuit, the method comprising:
 activating a first portion of a latch to produce a single-ended oscillation signal, the latch being coupled to a crystal oscillator;
 generating, based on the single-ended oscillation signal, first and second control signals;
 controlling a switched capacitor circuit with the first and second control signals; and
 activating a second portion of the latch to produce a differential oscillation signal.

16. The method of claim 15, wherein generating the first and second control signals comprises generating the first and second control signals to be out-of-phase relative to each other.

17. The method of claim 15, wherein controlling the switched capacitor circuit with the first and second control signals comprises:
 actuating a first switch of the switched capacitor circuit with the first control signal; and
 actuating a second switch of the switched capacitor circuit with the second control signal.

18. The method of claim 15, wherein generating the first and second control signals comprises:
 providing the single-ended oscillation signal to an input of a phased-locked loop (PLL); and
 generating the first and second control signals with the PLL.

19. The method of claim 15, wherein activating a first portion of the latch comprises activating a first transistor of the latch and wherein activating a second portion of the latch comprises activating a second transistor of the latch, the first and second transistors being arranged in a back-to-back configuration.

20. The method of claim 15, wherein activating the first portion of the latch precedes activating the second portion of the latch.

* * * * *